(12) United States Patent
Aram et al.

(10) Patent No.: US 7,161,420 B1
(45) Date of Patent: Jan. 9, 2007

(54) AMPLIFIERS WITH COMPENSATION

(75) Inventors: Farbod Aram, Los Altos Hills, CA (US); Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 11/292,436

(22) Filed: Dec. 2, 2005

Related U.S. Application Data

(63) Continuation of application No. 11/264,921, filed on Nov. 2, 2005.

(51) Int. Cl.
*H03F 1/36* (2006.01)
(52) U.S. Cl. .............................. 330/9; 330/84; 330/107
(58) Field of Classification Search .................... 330/9, 330/107, 109, 252, 292, 84, 98
See application file for complete search history.

(56) References Cited

U.S. PATENT DOCUMENTS

| | | | |
|---|---|---|---|
| 3,079,568 A | 2/1963 | Werth | 330/126 |
| 3,605,031 A | 9/1971 | Tongue | 330/262 |
| 5,121,075 A | 6/1992 | Roach | 330/126 |
| 6,002,299 A * | 12/1999 | Thomsen | 330/9 |
| 6,208,206 B1 * | 3/2001 | Leung et al. | 330/107 |
| 6,842,068 B1 | 1/2005 | Perrier et al. | 327/540 |
| 6,930,544 B1 * | 8/2005 | Yokoyama | 327/552 |

OTHER PUBLICATIONS

Application of the Operational Transconductance Amplifier (OTA) to Voltage-controlled Amplifiers and Active Filters; W. Grise, Department of IET, Morehead State University, Morehead, KY; 1998; http://engr.nmsu.edu/etti/winter98/electronics/grise/wrg.html; 10 pages.

* cited by examiner

*Primary Examiner*—Steven J. Mottola

(57) ABSTRACT

An amplifier circuit comprises a first operational transconductance (OTA) having an input and an output and a second OTA having an input that communicates with an output of the first OTA. A third OTA has an input that communicates with an input of the first OTA. A fourth OTA has an input that communicates with an output of the third OTA and an output that communicates with the input of the second OTA. A switched capacitance circuit selectively couples a capacitance to at least one of the input of the third OTA and the output of third OTA.

26 Claims, 14 Drawing Sheets

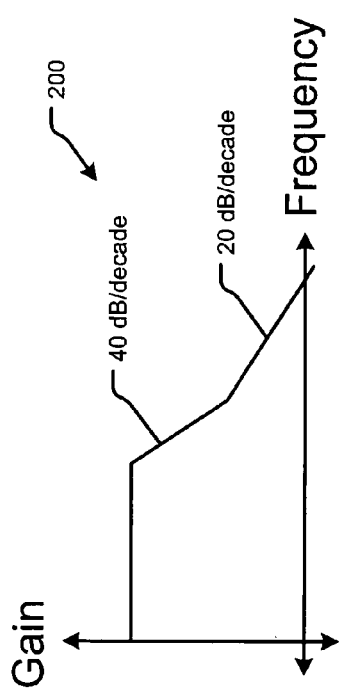
FIG. 4A
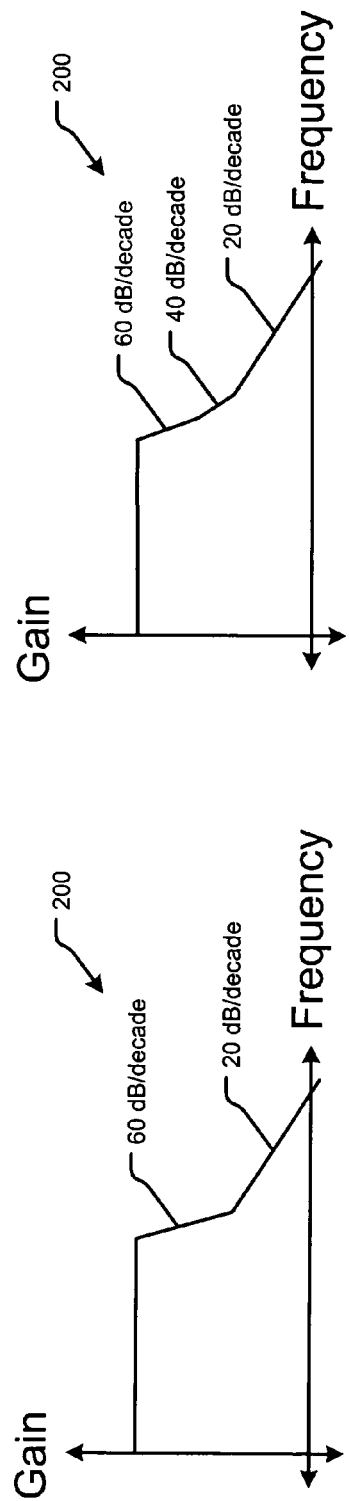
FIG. 4C
FIG. 4B

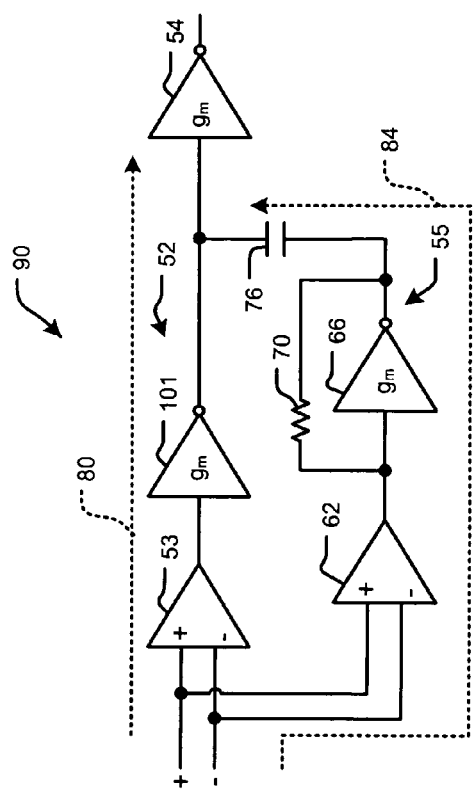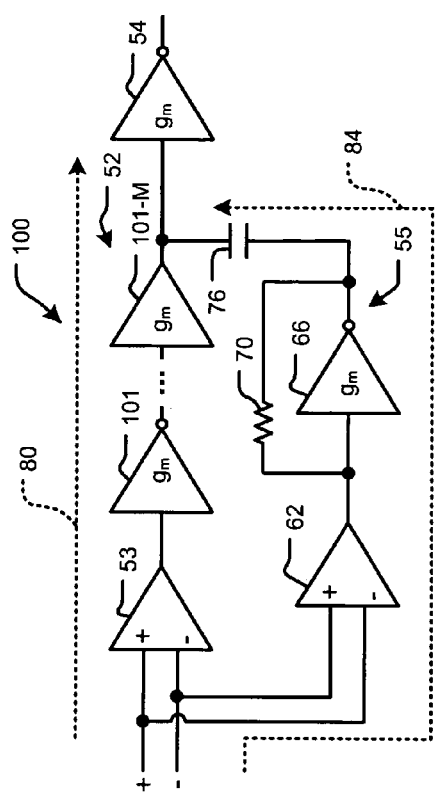
FIG. 5      FIG. 6

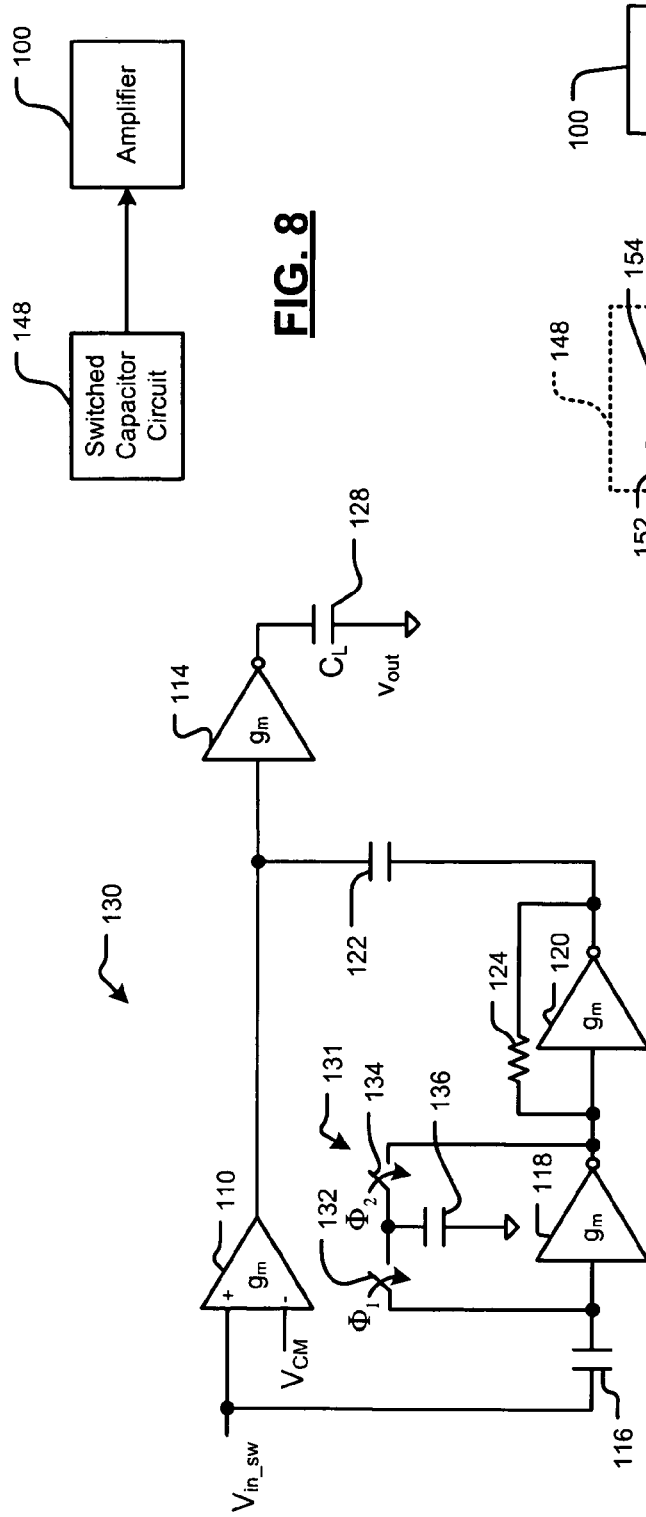
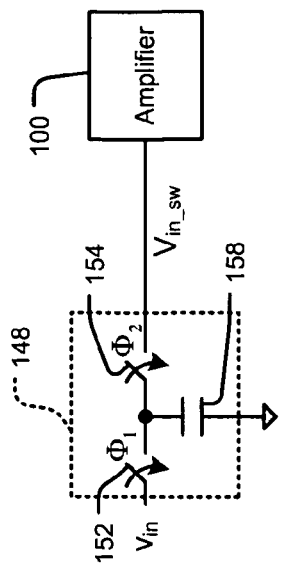
FIG. 7C
FIG. 8
FIG. 9

AMPLIFIERS WITH COMPENSATION

CROSS-REFERENCE TO RELATED APPLICATIONS

This application is a continuation of U.S. patent application Ser. No. 11/264,921 entitled "Amplifiers With Compensation", filed on Nov. 2, 2005. The disclosure of the above application is incorporated herein by reference.

FIELD OF THE INVENTION

The present invention relates to amplifiers, and more particularly to amplifiers with compensation.

BACKGROUND OF THE INVENTION

An amplifier may include one or more stages. Each stage may include an amplifier that provides gain. As frequency increases, the gain that is provided by the amplifier tends to fall off, which limits the bandwidth of the amplifier. As operating frequencies of electronic computing devices increase, amplifiers having high bandwidth and gain and low noise have become increasingly important.

Miller compensation is a conventional frequency compensation technique that involves the movement of a dominant pole of a gain stage to a lower frequency by increasing the effective input capacitance of the gain stage. Miller compensation circuits include a Miller capacitance that exploits the Miller effect. When the Miller capacitance is connected in a feedback arrangement, the capacitance appears much larger at the input of the amplifier. While the dominant pole may be moved to a lower frequency using this approach, the gain and bandwidth of the system is still somewhat limited.

Referring now to FIGS. 1 and 2, an amplifier circuit 10 with Miller compensation is shown and includes first and second amplifiers 14 and 16, respectively. An output of the first amplifier 14 communicates with an input of the second amplifier 16. A first end of a Miller capacitance 18 communicates with the input of the second amplifier 16 and a second end of the Miller capacitance 18 communicates with the output of the second amplifier 16.

An input voltage of the amplifier circuit 10 is applied to an input of the first amplifier 14. An output voltage of the amplifier circuit 10 is referenced from the output of the second amplifier 16. As a result of the Miller compensation, the transconductance, $g_m$, of the second amplifier 16 may be increased, which increases the bandwidth of the amplifier circuit 10. As can be seen in FIG. 2, the gain of the amplifier with Miller compensation has a 20 dB/decade slope.

Amplifiers may also be used with switched capacitive input signals. The switched capacitive input signals may be generated in analog to digital converters (ADCs), digital to analog converters (DACs), filters and/or other circuits. Traditional amplifiers such as those shown in FIG. 1 tend to have a difficult time providing sufficient gain and bandwidth at acceptable noise levels, particularly for switched capacitive input signals.

SUMMARY OF THE INVENTION

An amplifier circuit comprises a first amplifier having an input and an output. A second operational transconductance amplifier (OTA) has an input that communicates with the output of the first amplifier. A third amplifier has an input that communicates with the input of the first amplifier and an output. A fourth OTA has an input that communicates with the output of the third amplifier and an output. A feedback resistance communicates with the input and the output of the fourth OTA. A capacitance communicates with the output of the fourth OTA and with the input of the second OTA.

In other features, N OTAs are connected in series, wherein N is an integer greater than zero. An input of a first of the N OTAs communicates with the output the first amplifier and output of a last one of the N OTAs communicates with the input of the second OTA. The input of the third amplifier is capacitively coupled to the first amplifier. A switched capacitance circuit selectively communicates with of the input and the output of the third amplifier.

In other features, the switched capacitance circuit comprises a first switch having a first terminal that communicates with the input of the third amplifier. A second switch has a first terminal that communicates with the output the third amplifier. A capacitance has one end that communicates with second terminals of the first and second switches.

A digital to analog converter comprises the amplifier circuit and further comprises a circuit that generates a switched capacitance input signal that is input to the input of the amplifier circuit. An analog to digital converter comprises the amplifier circuit and further comprises a circuit that generates a switched capacitance input signal that is input to the input of the amplifier circuit. A filter comprises the amplifier circuit and further comprises a circuit that generates a switched capacitance input signal that is input to the input of the amplifier circuit.

An amplifier circuit comprises an input, an output, a low frequency path between the input and the output and a high frequency path between the input and the output that includes a first amplifier having an input and an output, a first operational transconductance amplifier (OTA) having an input that communicates with the output of the first amplifier, and an output that is capacitively coupled to the low frequency path, and a resistance that communicates with the input and the output of the first OTA.

In other features, the low frequency path includes N OTAs, wherein N is an integer greater than one, wherein a first one of the N OTAs communicates with the input and a last one of the N OTAs communicates with the output. The first amplifier communicates with an input of the first one of the N OTAs and the first OTA communicates with an input of a last one of the N OTAs. The low frequency path comprises a second amplifier. The low frequency path includes a second amplifier and N OTAs connected in series, wherein N is an integer greater than zero, wherein the second amplifier communicates with the input and an output of a last one of the N OTAs communicates with the output.

An amplifier circuit comprises an input, an output, a low frequency path between the input and the output, and a high frequency path between the input and the output that includes first amplifying means for amplifying and having an input and an output, first transconductance means for providing transconductance and having an input that communicates with the output of the first amplifying means, and an output that is capacitively coupled to the low frequency path, and resistance means for providing resistance that communicates with the input and the output of the first transconductance means.

In other features, the low frequency path includes N transconductance means for providing transconductance, wherein N is an integer greater than one, wherein a first one of the N transconductance means communicates with the input and a last one of the N transconductance means communicates with the output. The first amplifying means communicates with an input of the first one of the N transconductance means and the first transconductance means communicates with an input of a last one of the N transconductance means.

In other features, the low frequency path comprises second amplifying means for amplifying. The low frequency path includes second amplifying means for amplifying and N transconductance means connected in series, wherein N is an integer greater than zero, wherein the second amplifying means communicates with the input and an output of a last one of the N transconductance means communicates with the output. A digital to analog converter comprises the amplifier circuit and further comprises means for generating a switched capacitance input signal that is input to the input of the amplifier circuit. An analog to digital converter comprises the amplifier circuit and further comprising means for generating a switched capacitance input signal that is input to the input of the amplifier circuit. A filter comprises the amplifier circuit and further comprising means for generating a switched capacitance input signal that is input to the input of the amplifier circuit.

An amplifier circuit comprises an input, an output, and a low frequency path between the input and the output. A high frequency path between the input and the output includes first amplifying means for amplifying that communicates with the input and second transconductance means for providing a transconductance and having an input that communicates with the output of the first amplifying means and an output that is capacitively coupled to the low frequency path. Resistance means for providing resistance communicates with the input and the output of the second transconductance means.

In other features, the low frequency path includes N transconductance means for providing a transconductance, wherein N is an integer greater than one. A first one of the N transconductance means communicates with the input and a last one of the N transconductance means communicates with the output. The first amplifying means communicates with an input of the first one of the N transconductance means and the second transconductance means communicates with an input of a last one of the N transconductance means. The first of the N transconductance means comprises inverting and non-inverting inputs that communicate with non-inverting and inverting inputs of the first amplifying means. Capacitance means for providing a capacitance that communicates with the output. Thee low frequency path includes third amplifying means for amplifying and N transconductance means for providing a transconductance that are connected in series, wherein N is an integer greater than zero. The third amplifying means communicates with the input and a last one of the N transconductance means communicates with the output.

An amplifier circuit comprises a first operational transconductance (OTA) having an input and an output. A second OTA has an input that communicates with an output of the first OTA. A third OTA has an input that communicates with an input of the first OTA. A fourth OTA has an input that communicates with an output of the third OTA and an output that communicates with the input of the second OTA. A switched capacitance circuit selectively couples a capacitance to at least one of the input of the third OTA and the output of third OTA.

In other features, a resistance having an input that communicates with the input of the fourth OTA and an output that communicates with the output of the fourth OTA. The input of the third OTA is capacitively coupled to the input of the first OTA. The switched capacitance circuit comprises: a first switch having a first terminal that communicates with the input of the third OTA; a second switch having a first terminal that communicates with the output the third OTA; and a capacitance having one end that communicates with second terminals of the first and second switches.

In other features, a capacitance has one end that communicates with the input of the first OTA and an opposite end that communicates with the output of the second OTA. N additional OTAs connected in series between the output of the first OTA and the input of the second OTA.

A digital to analog converter comprises the amplifier circuit and further comprises a circuit that generates a switched capacitance input signal that is input to the input of the first OTA. An analog to digital converter comprises the amplifier circuit and further comprises a circuit that generates a switched capacitance input signal that is input to the input of the first OTA. A filter comprises the amplifier circuit and further comprises a circuit that generates a switched capacitance input signal that is input to the input of the first OTA. The switched capacitance input signal includes first and second phases and wherein switches in the switched capacitance circuit are switched based on the first and second phases of the switched capacitance input signal.

An amplifier circuit comprises first transconductance means for providing a transconductance and having an input and an output. Second transconductance means provides a transconductance and has an input that communicates with an output of the first transconductance means. Third transconductance means provides a transconductance and has an input that communicates with an input of the first transconductance means. Fourth transconductance means provides a transconductance and has an input that communicates with an output of the third transconductance means and an output that communicates with the input of the second transconductance means. Switched capacitance means selectively provides capacitance and has an input that selectively communicates with an input of the third transconductance means and an output that selectively communicates with the output of the third transconductance means.

In other features, resistance means for providing resistance has an input that communicates with the input of the fourth transconductance means and an output that communicates with the output of the fourth transconductance means. The input of the third transconductance means is capacitively coupled to the input of the first transconductance means. The switched capacitance means comprises: first switching means for switching and having a first terminal that communicates with the input of the third transconductance means; second switching means for switching and having a first terminal that communicates with the output the third transconductance means; and capacitance means for providing capacitance and having one end that communicates with second terminals of the first and second switching means.

In other features, capacitance means for providing capacitance has one end that communicates with the input of the first transconductance means and an opposite end that communicates with the output of the second transconductance means. N additional transconductance means for providing a transconductance are connected in series between the output of the first transconductance means and the input of the second transconductance means, where N is an integer greater than zero.

A digital to analog converter comprises the amplifier circuit and further comprises means for generating a switched capacitance input signal that is input to the input of the first transconductance means. An analog to digital converter comprises the amplifier circuit and further comprises means for generating a switched capacitance input signal that is input to the input of the first transconductance means. A filter comprises the amplifier circuit and further comprises means for generating a switched capacitance input signal that is input to the input of the first transconductance means. The switched capacitance input signal includes first and second phases. The first and second switching means in the switched capacitance means are switched based on the first and second phases of the switched capacitance input signal. The amplifier circuit is configured in a differential mode.

An amplifier circuit comprises a first amplifier comprising an input and an output and having a first gain, a first bandwidth and a first output impedance. A second amplifier module comprises an input that communicates with the input of the first amplifier and an output and has a second gain that is less than the first gain, a second bandwidth that is greater than the first bandwidth and an output impedance that is less than the first output impedance. A capacitance communicates with the output of the second amplifier module and an output of the first amplifier.

In other features, the first gain is greater than or equal to 100 and the second gain is less than one hundred. The second amplifier module includes an operational transconductance amplifier. The second amplifier module comprises a third amplifier having an input that communicates with the input of the first amplifier and an output, a fourth operational transconductance amplifier (OTA) having an input that communicates with the output of the third amplifier and an output, and a first resistance that communicates with the input and the output of the fourth OTA.

In other features, a third operational transconductance amplifier (OTA) communicates with the output of the first amplifier. N operational transconductance amplifiers (OTAs) are connected in series, wherein N is an integer greater than zero. An input of a first of the N OTAs communicates with the output the first amplifier and output of a last one of the N OTAs communicates with the input of the third OTA.

An amplifier circuit comprises first amplifying means for amplifying comprising an input and an output and having a first gain, a first bandwidth and a first output impedance. Second amplifying module means for amplifying comprises an input and an output and having a second gain that is less than the first gain, a second bandwidth that is greater than the first bandwidth and an output impedance that is less than the first output impedance. Capacitance means for providing capacitance communicates with the output of the second amplifying module means and an output of the first amplifying means.

In other features, the first gain is greater than or equal to 100 and the second gain is less than one hundred. The second amplifying module means includes an operational transconductance amplifier. The second amplifying module means comprises third amplifying means for amplifying and having an input that communicates with the input of the first amplifying means and an output; fourth transconductance means for providing transconductance having an input that communicates with the output of the third amplifying means and an output; resistance means for providing resistance that communicates with the input and the output of the fourth transconductance means.

In other features, third transconductance means for providing transconductance communicates with the output of the first amplifying means. N transconductance means for providing transconductance are connected in series, wherein N is an integer greater than zero. An input of a first of the N transconductance means communicates with the output the first amplifying means and output of a last one of the N transconductance means communicates with the input of the third transconductance means.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 4A–4C are graphs illustrating exemplary gain and bandwidth for the amplifiers;

FIGS. 5 and 6 are electrical schematics of amplifiers with compensation and additional gain stages according to the present invention;

FIG. 7C is an electrical schematic of an amplifier according to the present invention with a switched capacitance circuit;

FIG. 8 is a functional block diagram illustrating an exemplary switched input comprising a switched capacitance circuit and the amplifier of FIG. 7C;

FIG. 9 is a functional block diagram and electrical schematic illustrating an exemplary switched capacitance circuit;

DETAILED DESCRIPTION OF THE PREFERRED EMBODIMENTS

Figure 1:
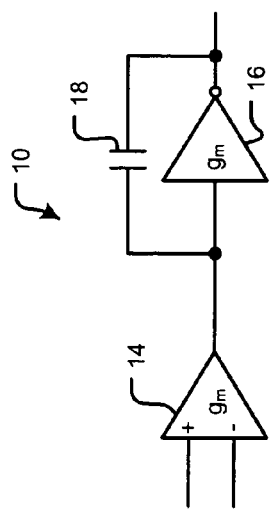
FIG. 1 is an electrical schematic of an amplifier with Miller compensation according to the prior art.
Figure 2:
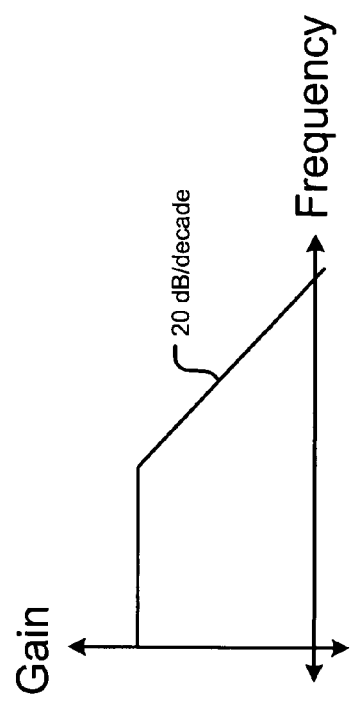
FIG. 2 is a graph illustrating gain and bandwidth for the amplifier of FIG. 1.

The following description of the preferred embodiment(s) is merely exemplary in nature and is in no way intended to limit the invention, its application, or uses. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention. For purposes of clarity, the same reference numbers will be used in the drawings to identify similar elements.

Figure 3B:
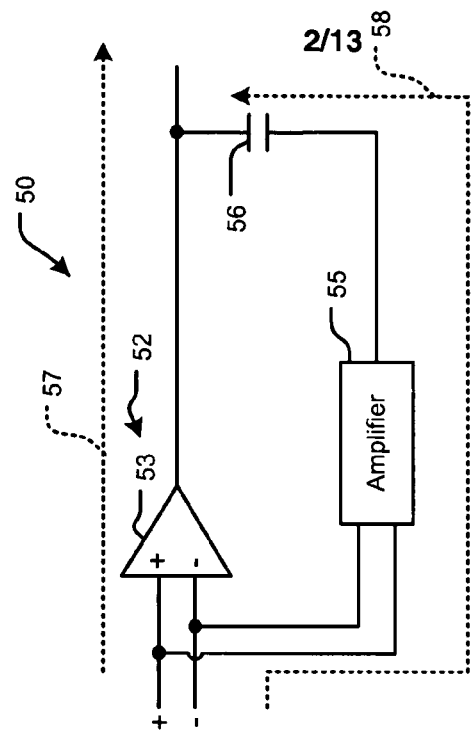
FIG. 3B is an electrical schematic of an exemplary amplifier with compensation according to the present invention.
Figure 3A:
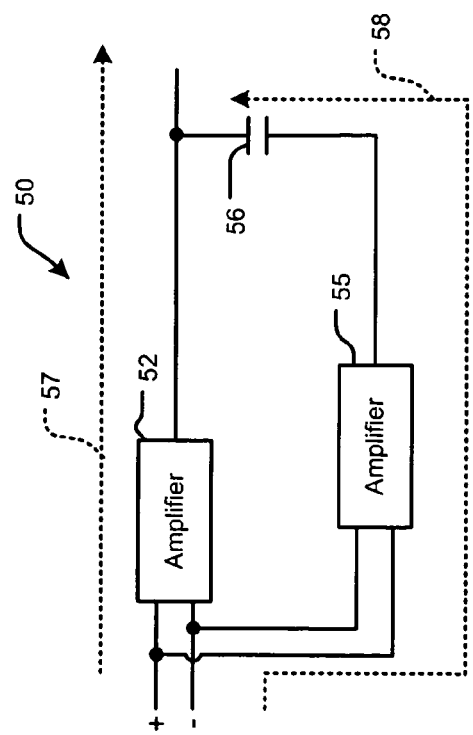
FIG. 3A is an electrical schematic of an exemplary amplifier with compensation according to the present invention.

Referring now to FIG. 3A, an electrical schematic of an amplifier circuit 50 with compensation according to the present invention is shown. While specific examples of amplifier circuits will be shown and described, other combinations are contemplated. The amplifier circuit 50 includes a first amplifier module 52 having an input and an output. The inputs of the amplifier module 52 communicate with inputs of an amplifier module 55. Outputs of the amplifier module 55 are coupled by a capacitor 56 to the output of the amplifier module 52.

The amplifier module 55 may have a gain that is less than the gain of the amplifier module 52. The amplifier module 52 may have a gain that is greater than or equal to 100. The amplifier module 55 may have a gain that is less than 100. In some implementations, the gain of the amplifier module 55 is substantially less than 100. The amplifier module 55 may have a very high bandwidth and a low output impedance. The amplifier module 55 may have a bandwidth that is greater than a bandwidth of the amplifier module 52. The output impedance of the amplifier module 52 may be greater than the output impedance of the amplifier module 55. The amplifier module 55 may include a transimpedance amplifier. The amplifier circuit 50 has a first DC path 57 and a second high frequency path 58.

Figure 3C:
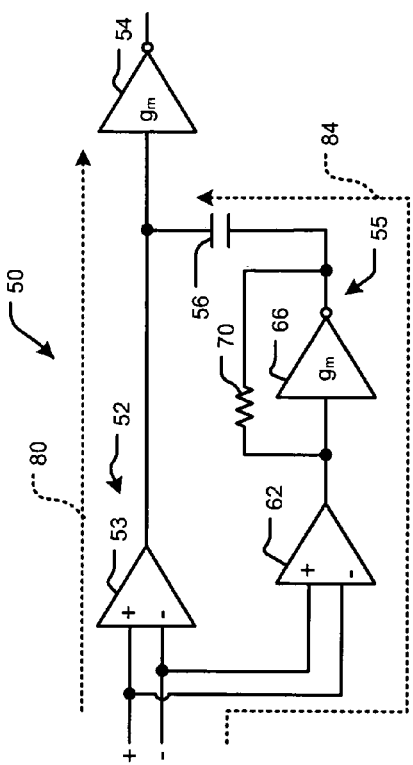
FIG. 3C is an electrical schematic of an exemplary amplifier with compensation according to the present invention.
Figure 3D:
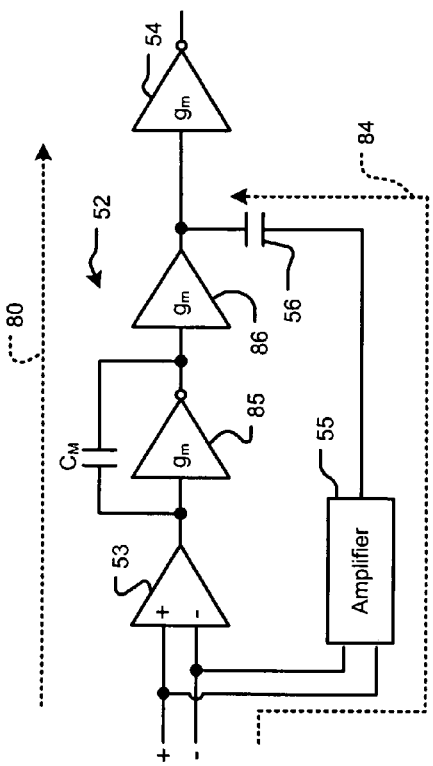
FIG. 3D is an electrical schematic of an exemplary amplifier with compensation according to the present invention.

Referring now to FIGS. 3B–3D, various combinations of amplifiers can be used in the amplifier modules 52 and 55 of the amplifier circuit 50. While specific examples will be shown, other combinations are contemplated. In FIG. 3B, the amplifier module 52 may include an amplifier 53. In FIG. 3C, the amplifier module 55 may include a transimpedance amplifier. In FIG. 3D, the amplifier module 52 may include a Miller compensated amplifier. Still other variations are contemplated.

Referring back to FIG. 3C, the amplifier circuit 50, which includes the amplifier module 52 that includes a first amplifier 53 having an output that communicates with an input of a second amplifier 54. Inputs of the amplifier 53 are coupled to the amplifier module 55. The amplifier module 55 includes an amplifier 62, an amplifier 66 and a feedback resistance 70. An output of the amplifier 62 is coupled to an input of the amplifier 66. The feedback resistance 70 is connected between the input of the amplifier 66 and an output of the amplifier 66. A capacitance element 56 capacitively couples the output of the amplifier 66 to the input of the amplifier 54. The amplifiers 53 and 54 provide a DC gain path 80. Gain of the DC gain path 80 can be adjusted using additional amplifiers. The amplifiers 62 and 66 and the capacitance 56 provide a high-frequency gain path 84.

Referring now to FIG. 3D, the amplifier module 52 may include the amplifier 53 and a Miller compensated amplifier 85 with capacitive feedback $C_M$. An additional amplifier 86 may be provided between the output of the Miller compensated amplifier 85 and the input of the amplifier 54. Still other combinations are contemplated.

Referring now to FIGS. 4A–4C, exemplary graphs illustrating gain and bandwidth for the amplifier circuits are shown. As can be appreciated, the amplifier circuit 50 in FIG. 3A has additional bandwidth at higher gain values. A slope of the gain is increased to 40 dB/decade such that the gain falls off later but more quickly. Additional gain stages may further increase the slope to 60 dB/decade as shown in FIG. 4B. Depending upon the stages and/or configuration, regions of the gain-bandwidth response may have a slope of 20, 40, 60, etc dB/decade as shown in FIG. 4C.

Referring now to FIGS. 5 and 6, electrical schematics of other amplifiers with compensation and additional gain are shown. One or more additional amplifiers may be provided in the DC gain path 80 to provide additional gain. In FIG. 5, an amplifier circuit 90 includes amplifiers 53 and 101 that are connected between the input of the amplifier 90 and the amplifier 54. In FIG. 6, an amplifier circuit 100 includes one or more additional amplifiers 101-M that are connected between amplifiers 52-2 and 54, where M is an integer greater than one. As can be appreciated, additional amplifier stages may be added to the DC path to provide additional gain as needed.

The amplifier circuits according to the present invention have improved gain at both high and low frequency and improved settling time. The amplifier circuits have high gain while operating at low voltage because each stage can now be configured in a non-cascode arrangement.

Figure 7A:
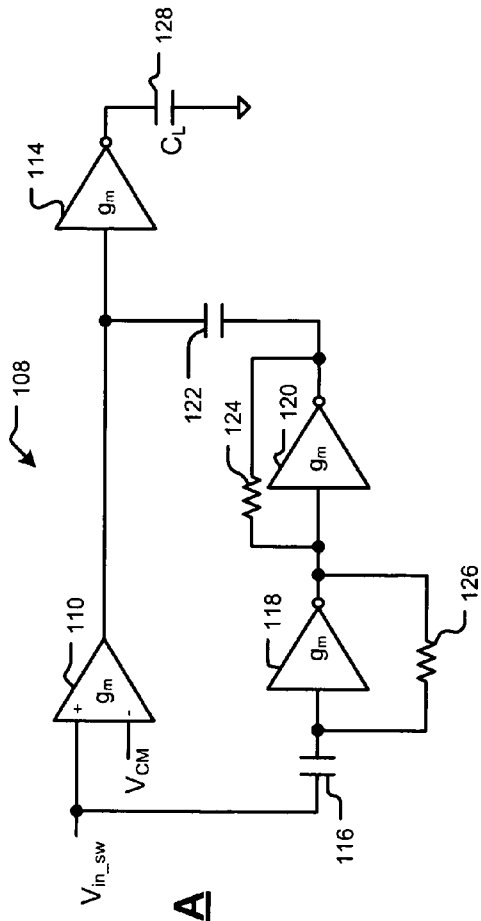
FIG. 7A is an electrical schematic of an exemplary amplifier according to the present invention.
Figure 7B:
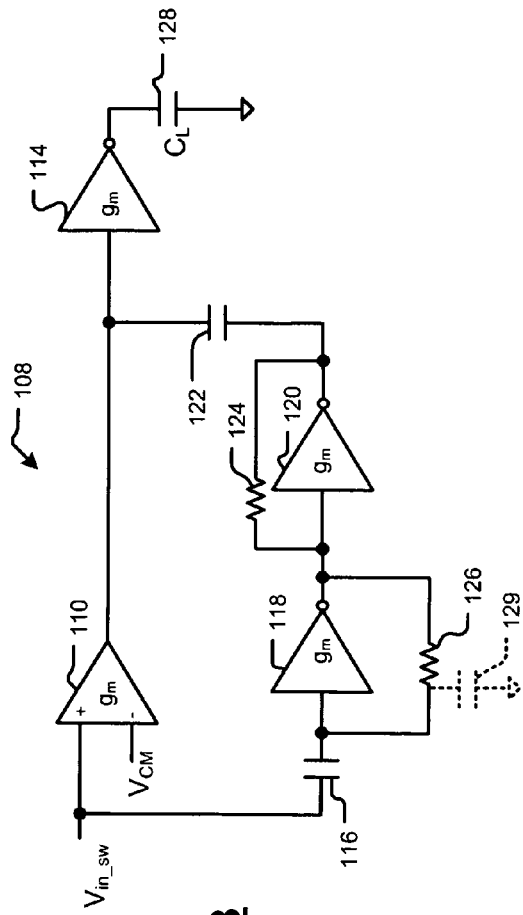
FIG. 7B is an electrical schematic of the amplifier of FIG. 7A with parasitic capacitance.

Referring now to FIGS. 7A and 7B, an amplifier circuit 108 includes an amplifier 110 having an input and an output that is coupled to an input of an amplifier 114. The input of the amplifier 110 is coupled by a capacitance 116 to an input of an amplifier 118. An output of the amplifier 118 is coupled to an input of the amplifier 120. An output of the amplifier 120 is coupled by a capacitance 122 to the input of the amplifier 114.

A feedback resistance 124 is connected to the input and output of the amplifier 120. A feedback resistance 126 is connected to the input and output of the amplifier 118. The feedback resistance 126 may have a high resistance value. For example, the feedback resistance may have a resistance value that is greater than a resistance value of the resistance 124. The feedback resistance 126 may have a very high resistance, for example a resistance approaching infinity. A load capacitance 128 may be connected to an output of the amplifier 114. In FIG. 7B, parasitic capacitance 129 associated with the relatively high feedback resistance 126 may tend to limit bandwidth of the circuit.

In FIG. 7C, an amplifier circuit 130 according to the present invention is shown. The amplifier circuit 130 may include a switched capacitance to simulate the high feedback resistance 126 without the problems associated with parasitic capacitance. The amplifier circuit 130 includes an amplifier 110 having an output that is coupled to an input of an amplifier 114. An input of the amplifier 110 is also coupled by a capacitance 116 to an input of an amplifier 118.

An output of the amplifier 118 is coupled to an input of the amplifier 120. An output of the amplifier 120 is coupled by a capacitance 122 to the input of the amplifier 114.

The input and output of the amplifier 118 may communicate with a switched capacitance circuit 131. The switched capacitance circuit 131 includes first and second switches 132 and 134. A capacitance 136 is connected between the switches 132 and 134 and a reference potential such as ground. During a first phase $\Phi_1$, the first switch 132 is closed and the second switch 134 is open and the capacitance 136 is charged. During a second phase $\Phi_2$, the first switch 132 is open and the second switch 134 is closed, which allows the capacitance 136 to discharge. The first and second phases may correspond to the first and second phases of the switched input and/or vice versa. A feedback resistor 124 is connected to the input and output of the amplifier 120. A load capacitance 146 may be connected to an output of the amplifier 114. In some applications, the amplifier 130 may receive a switched input. The switched input may be a switched capacitive input such as that found in capacitive ADCs, DACs, filters and the like.

Referring now to FIGS. 8 and 9, an exemplary circuit comprising a switched capacitance circuit 148 and the amplifier 130 of FIG. 7C are shown. An input voltage to the amplifier circuit 130 may be a switched capacitance input. Switched capacitance inputs may be generated in circuits such as filters, digital to analog converters (DAC), analog to digital converters (ADC) and other circuits. As can be appreciated, other types of input and/or other switched capacitance circuits may be used. The switched capacitance circuit 148 includes first and second switches 152 and 154. A capacitance 158 is connected between the switches 152 and 154 and a reference potential such as ground. During a first phase $\Phi_1$, the first switch 152 is closed and the second switch 154 is open and the capacitance 158 is charged. During a second phase $\Phi_2$, the first switch 152 is open and a second switch 154 is closed and the capacitance 158 discharges via the amplifier 100.

Figure 10:
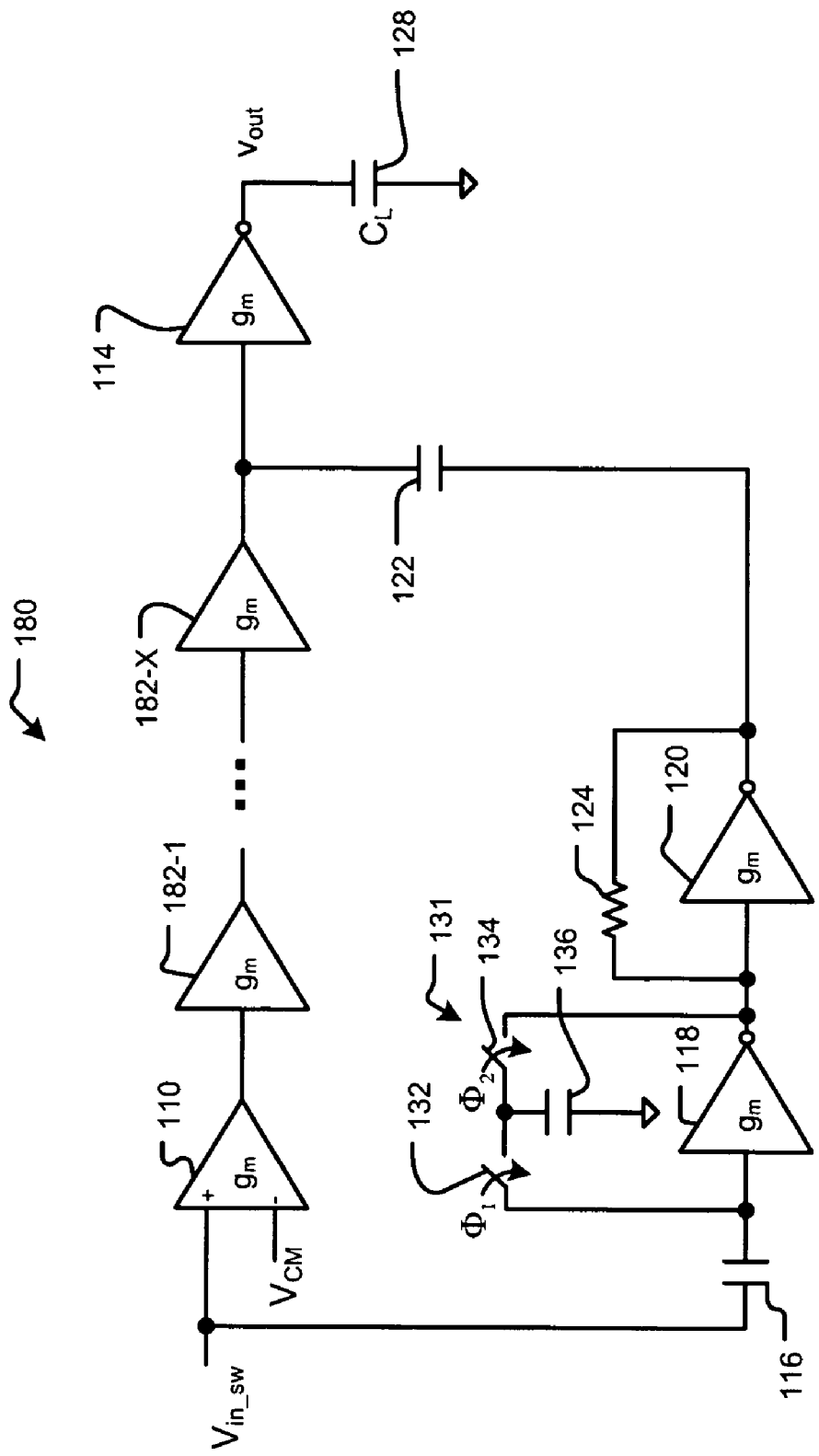
FIG. 10 is an electrical schematic of the amplifier of FIG. 7C with additional amplifier stages.

Referring now to FIG. 10, an amplifier circuit 180 is similar to that shown in FIG. 7C and further includes amplifiers 182-1, 182-2, . . . 182-X, where X is an integer greater than zero. The additional amplifiers 182 tend to increase the slope of the gain-bandwidth response in a region 200 shown in FIG. 4.

Figure 11:
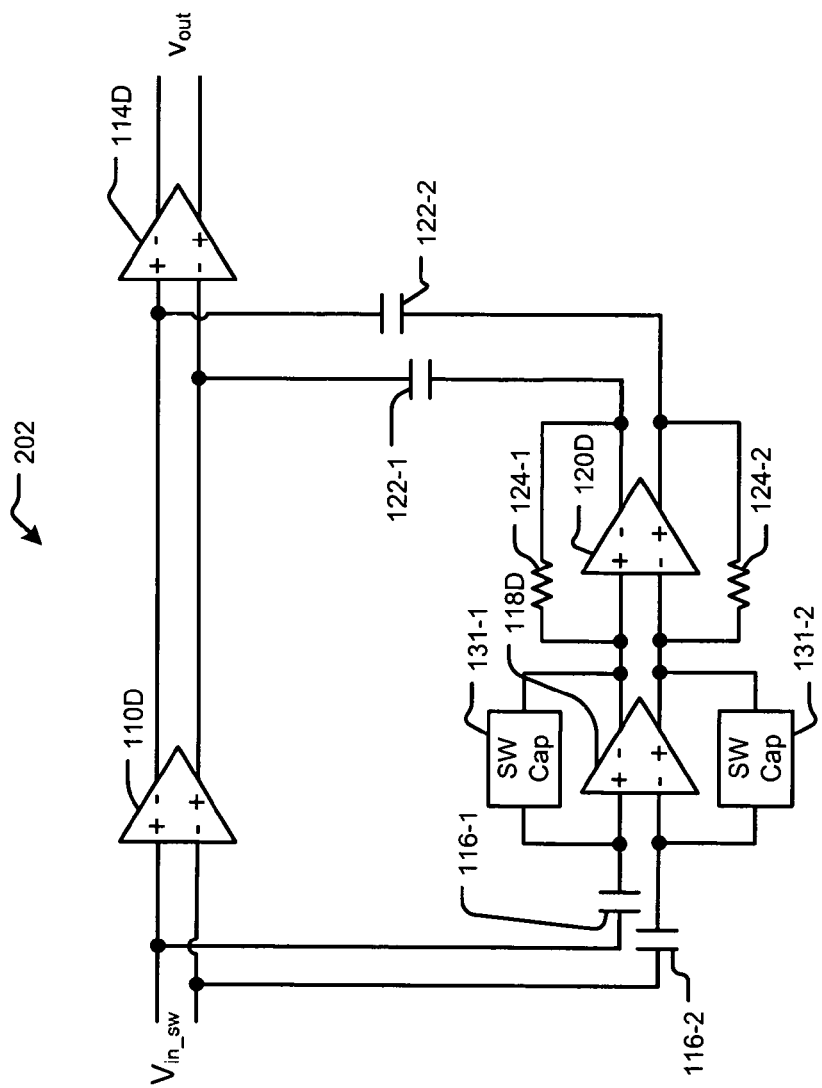
FIG. 11 is electrical schematic of the amplifier of FIG. 7C configured in a differential mode.

Any of the amplifier circuits described above can be configured in a differential mode. For example and referring now to FIG. 11, the amplifier of FIG. 7C can be configured in a differential mode. Other amplifiers described herein may be configured in a differential mode as well. An amplifier 202 according to the present invention that receives a differential switched input is shown. The amplifier 202 includes a differential amplifier 110D having differential outputs that are coupled to differential inputs of a differential amplifier 114D. Differential inputs of the differential amplifier 110D are also coupled by capacitances 116-1 and 116-2 to differential inputs of a differential amplifier 118D. Differential outputs of the differential amplifier 118D are coupled to differential inputs of the differential amplifier 120D. Differential outputs of the differential amplifier 120D are coupled by capacitances 122-1 and 122-2 to the differential inputs of the differential amplifier 114D.

The differential inputs and differential outputs of the differential amplifier 118D communicate with switched capacitance circuits 131-1 and 131-2. Load capacitances (not shown) may be connected to differential outputs of the differential amplifier 114D.

The amplifiers described herein may be amplifiers, operational amplifiers, operational transconductance amplifiers (OTAs), amplifiers with Miller compensation and/or other suitable amplifiers. The OTA is a transconductance type device. The input voltage controls an output current based on the transconductance $g_m$. In other words, the OTA is a voltage-controlled current source (VCCS), which is in contrast to the conventional amplifier (opamp), which is a voltage-controlled voltage source (VCVS).

The transconductance parameter of the OTA is controlled by an amplifier bias current. From this controlled transconductance, the output current is a function of the applied voltage difference between the input pins. There are two key differences between the OTA and the conventional opamp. First, since the OTA is a current source, the output impedance of the device is high. In contrast, the output impedance of the opamp is very low. Second, it is possible to design circuits using the OTA that do not employ negative feedback. In other words, instead of employing feedback to reduce the sensitivity of a circuit's performance to device parameters.

Figure 12B:
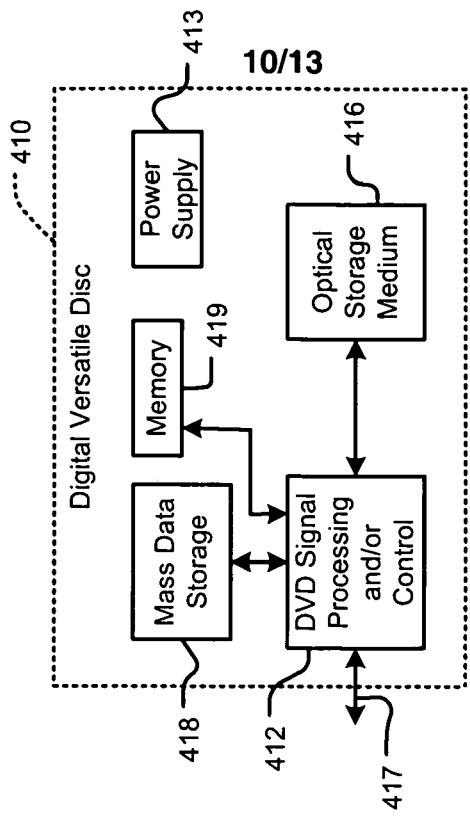
FIG. 12B is a functional block diagram of a digital versatile disk (DVD)
Figure 12A:
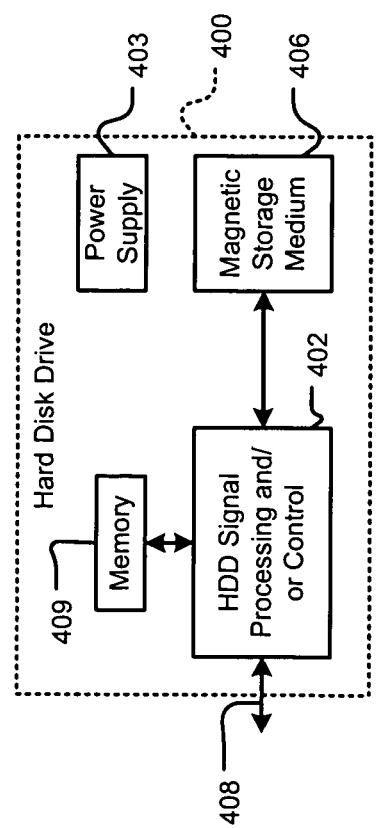
FIG. 12A is a functional block diagram of a hard disk drive.

Referring now to FIGS. 12A–12G, various exemplary implementations of the present invention are shown. Referring now to FIG. 12A, the present invention can be implemented amplifiers, ADC, DAC, filters and other circuits in a hard disk drive 400. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 12B, the present invention can be implemented in amplifiers, ADC, DAC, filters and other circuits of a digital versatile disc (DVD) drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 12A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 12D:
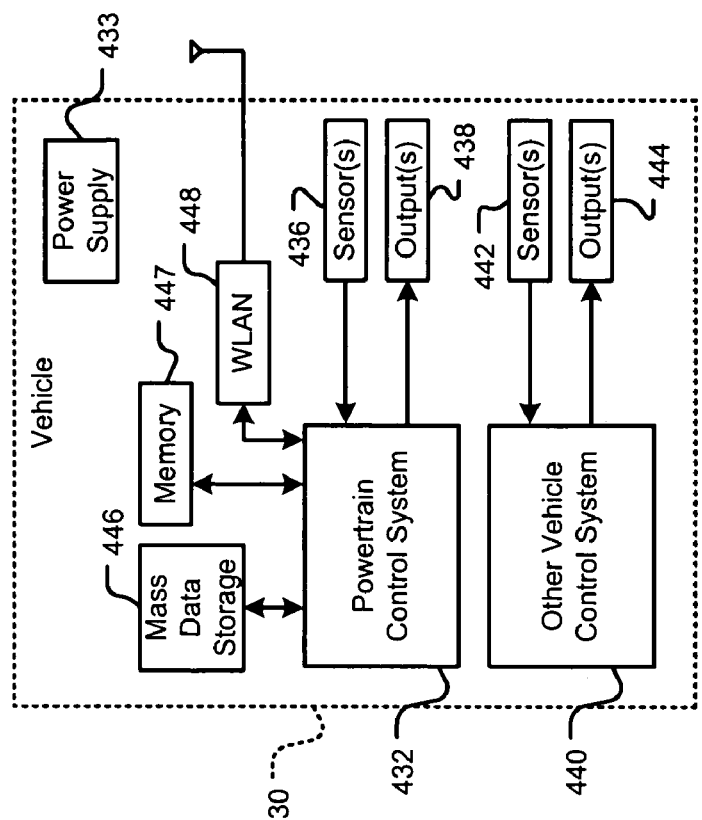
FIG. 12D is a functional block diagram of a vehicle control system.
Figure 12C:
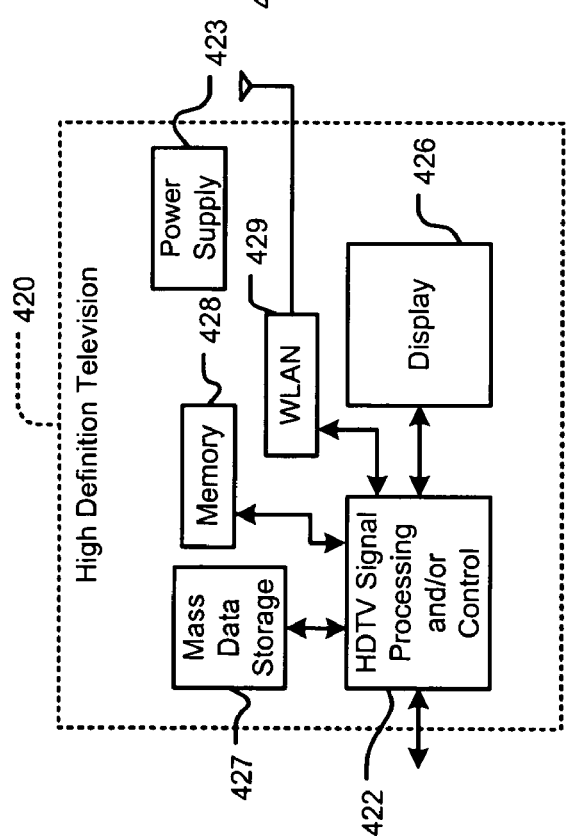
FIG. 12C is a functional block diagram of a high definition television.

Referring now to FIG. 12C, the present invention can be implemented in amplifiers, ADC, DAC, filters and other circuits of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 12A and/or at least one DVD may have the configuration shown in FIG. 12B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 12D, the present invention may implement and/or be implemented in amplifiers, ADC, DAC, filters and other circuits of a control system of a vehicle 430, a WLAN interface, mass data storage of the vehicle control system and/or a power supply 433. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 12E:
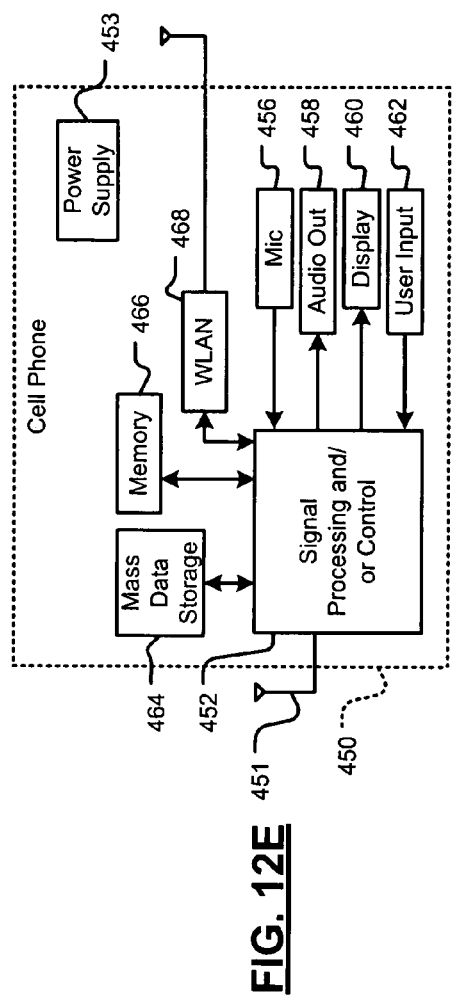
FIG. 12E is a functional block diagram of a cellular phone.

Referring now to FIG. 12E, the present invention can be implemented in amplifiers, ADC, DAC, filters and other circuits of a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 12F:
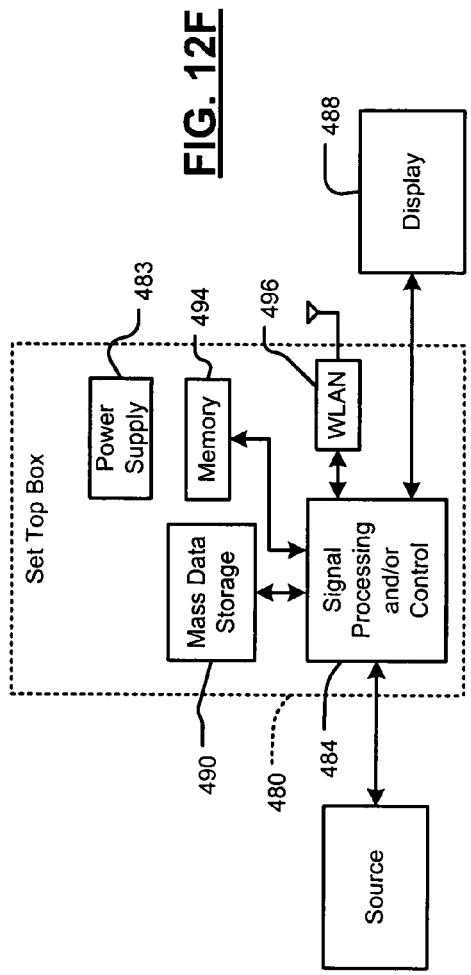
FIG. 12F is a functional block diagram of a set top box.

Referring now to FIG. 12F, the present invention can be implemented in amplifiers, ADC, DAC, filters and other circuits of a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The set top box 480 may be connected to memory 4124 such as RAM, ROM, low latency nonvolatile memory such as flash memory and/or other suitable electronic data storage. The set top box 480 also may support connections with a WLAN via a WLAN network interface 4126.

Figure 12G:
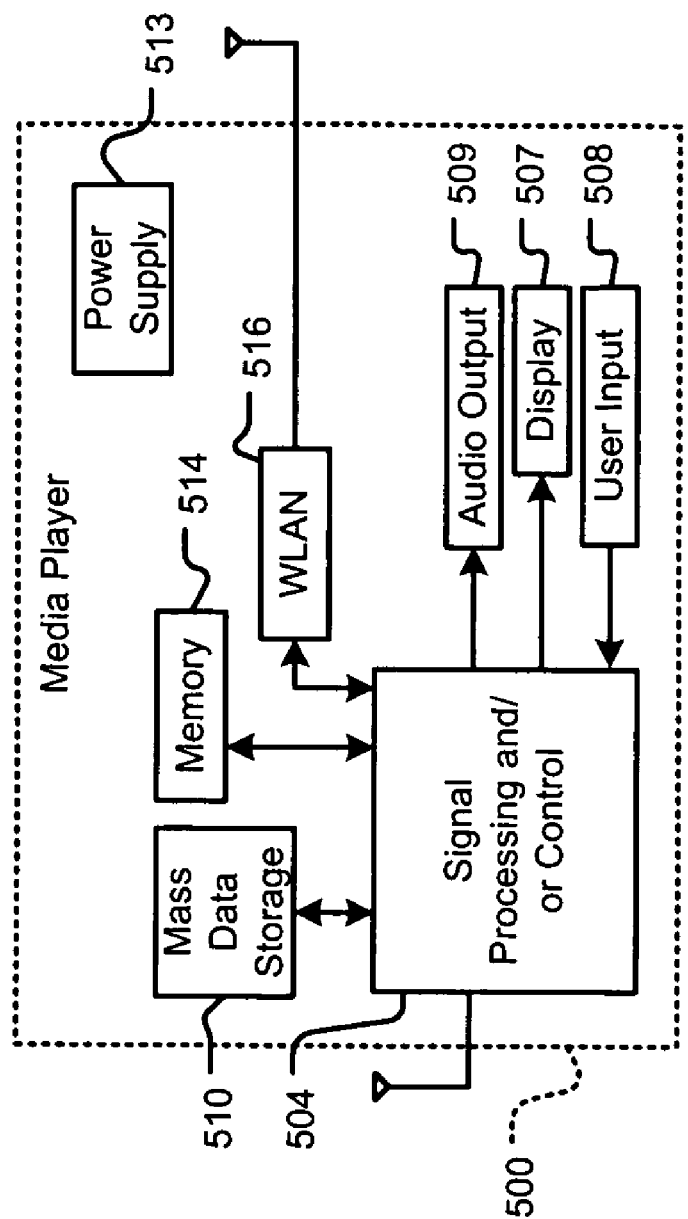
FIG. 12G is a functional block diagram of a media player.

Referring now to FIG. 12G, the present invention can be implemented in amplifiers, ADC, DAC, filters and other circuits of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Figure 13A:
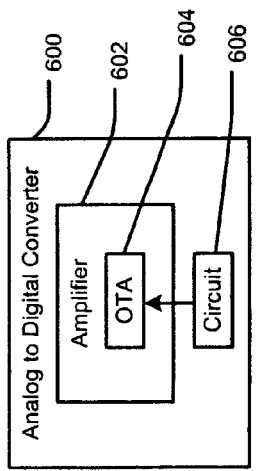
FIG. 13A is a functional block diagram of a digital to analog converter.
Figure 13B:
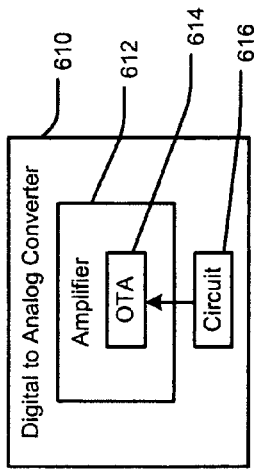
FIG. 13B is a functional block diagram of an analog to digital converter.
Figure 13C:
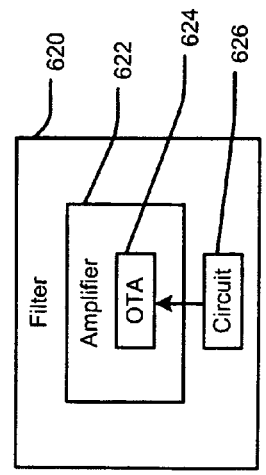
FIG. 13C is a functional block diagram of a filter.

Referring now to FIGS. 13A–13C, various implementations are shown. In FIG. 13A, a digital to analog converter 600 comprises an amplifier circuit 602 and further comprises a circuit 606 that generates a switched capacitance input signal that is input to the input of an OTA 604. In FIG. 13B, an analog to digital converter 610 comprises an amplifier circuit 612 and further comprises a circuit 616 that generates a switched capacitance input signal that is input to the input of an OTA 614. In FIG. 13C, a filter 620 comprises an amplifier circuit 622 and further comprises a circuit 626 that generates a switched capacitance input signal that is input to the input of an OTA 624.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An amplifier circuit comprising:
    a first operational transconductance (OTA) having an input and an output;
    a second OTA having an input that communicates with an output of said first OTA;
    a third OTA having an input that communicates with an input of said first OTA;
    a fourth OTA having an input that communicates with an output of said third OTA and an output that communicates with said input of said second OTA; and
    a switched capacitance circuit that selectively couples a capacitance to at least one of said input of said third OTA and said output of said third OTA.

2. The amplifier circuit of claim 1 further comprising a resistance having an input that communicates with said input of said fourth OTA and an output that communicates with said output of said fourth OTA.

3. The amplifier circuit of claim 1 wherein said switched capacitance circuit comprises:
    a first switch having a first terminal that communicates with said input of said third OTA;
    a second switch having a first terminal that communicates with said output said third OTA; and
    a capacitance having one end that communicates with second terminals of said first and second switches.

4. The amplifier circuit of claim 1 further comprising a capacitance having one end that communicates with said input of said first OTA and an opposite end that communicates with said output of said second OTA.

5. The amplifier circuit of claim 1 further comprising N additional OTAs connected in series between said output of said first OTA and said input of said second OTA.

6. A digital to analog converter comprising the amplifier circuit of claim 1 and further comprising a circuit that generates a switched capacitance input signal that is input to said input of said first OTA.

7. An analog to digital converter comprising the amplifier circuit of claim 1 and further comprising a circuit that generates a switched capacitance input signal that is input to said input of said first OTA.

8. A filter comprising the amplifier circuit of claim 1 and further comprising a circuit that generates a switched capacitance input signal that is input to said input of said first OTA.

9. The digital to analog converter of claim 6 wherein said switched capacitance input signal includes first and second phases and wherein switches in said switched capacitance circuit are switched based on said first and second phases of said switched capacitance input signal.

10. The analog to digital converter of claim 7 wherein said switched capacitance input signal includes first and second phases and wherein switches in said switched capacitance circuit are switched based on said first and second phases of said switched capacitance input signal.

11. The filter of claim 8 wherein said switched capacitance input signal includes first and second phases and wherein switches in said switched capacitance circuit are switched based on said first and second phases of said switched capacitance input signal.

12. The amplifier circuit of claim 1 wherein said amplifier circuit is configured in a differential mode.

13. The amplifier circuit of claim 1 further comprising a capacitance having one end that communicates with said input of said first OTA and an opposite end that communicates with said input of said third OTA.

14. An amplifier circuit comprising:
    first transconductance means for providing a transconductance and having an input and an output;
    second transconductance means for providing a transconductance and having an input that communicates with an output of said first transconductance means;
    third transconductance means for providing a transconductance and having an input that communicates with an input of said first transconductance means;
    fourth transconductance means for providing a transconductance and having an input that communicates with an output of said third transconductance means and an output that communicates with said input of said second transconductance means; and
    switched capacitance means for selectively providing capacitance and having an input that selectively communicates with an input of said third transconductance means, an output that selectively communicates with said output of said third transconductance means.

15. The amplifier circuit of claim 14 further comprising resistance means for providing resistance and having an input that communicates with said input of said fourth transconductance means and an output that communicates with said output of said fourth transconductance means.

16. The amplifier circuit of claim 14 wherein said switched capacitance means comprises:
    first switching means for switching and having a first terminal that communicates with said input of said third transconductance means;
    second switching means for switching and having a first terminal that communicates with said output said third transconductance means; and
    capacitance means for providing capacitance and having one end that communicates with second terminals of said first and second switching means.

17. The amplifier circuit of claim 14 further comprising capacitance means for providing capacitance and having one end that communicates with said input of said first transconductance means and an opposite end that communicates with said output of said second transconductance means.

18. The amplifier circuit of claim 14 further comprising N additional transconductance means for providing a transconductance that are connected in series between said output of said first transconductance means and said input of said second transconductance means, where N is an integer greater than zero.

19. A digital to analog converter comprising the amplifier circuit of claim 14 and further comprising means for generating a switched capacitance input signal that is input to said input of said first transconductance means.

20. An analog to digital converter comprising the amplifier circuit of claim 14 and further comprising means for generating a switched capacitance input signal that is input to said input of said first transconductance means.

21. A filter comprising the amplifier circuit of claim 14 and further comprising means for generating a switched capacitance input signal that is input to said input of said first transconductance means.

22. The digital to analog converter of claim 19 wherein said switched capacitance input signal includes first and second phases and wherein said first and second switching means in said switched capacitance means are switched based on said first and second phases of said switched capacitance input signal.

23. The analog to digital converter of claim 20 wherein said switched capacitance input signal includes first and second phases and wherein said first and second switching means in said switched capacitance means are switched based on said first and second phases of said switched capacitance input signal.

24. The filter of claim 21 wherein said switched capacitance input signal includes first and second phases and wherein said first and second switching means in said switched capacitance means are switched based on said first and second phases of said switched capacitance input signal.

25. The amplifier circuit of claim 14 wherein said amplifier circuit is configured in a differential mode.

26. The amplifier circuit of claim 14 further comprising means for providing capacitance and capacitance having one end that communicates with said input of said first transconductance means and an opposite end that communicates with said input of said third transconductance means.

* * * * *

UNITED STATES PATENT AND TRADEMARK OFFICE
CERTIFICATE OF CORRECTION

PATENT NO. : 7,161,420 B1  Page 1 of 1
APPLICATION NO. : 11/292436
DATED : January 9, 2007
INVENTOR(S) : Farbod Aram et al.

It is certified that error appears in the above-identified patent and that said Letters Patent is hereby corrected as shown below:

| | |
|---|---|
| Title Page, Line 2 | Item (57) Abstract, insert -- amplifier -- after "transconductance" |
| Column 2, Line 8 | Add -- of -- after "output" |
| Column 2, Line 12 | Delete "of" after "with" |
| Column 2, Line 17 | Add -- of -- after "output" |
| Column 3, Line 46 | Delete "Thee" and insert -- The -- |
| Column 4, Line 52 | Insert -- of -- after "output" |
| Column 5, Line 38 | Insert -- of -- after "output" |
| Column 6, Line 1 | Insert -- of -- after "output" |
| Column 6, Line 66 | Delete "and" after "box;" |
| Column 6, Line 67 | Delete "." And insert -- ; -- |
| Column 7, Line 2 | Delete "and" after "converter;" |
| Column 7, Line 4 | Insert -- and -- after "converter;" |
| Column 13, Line 33 | Insert -- amplifier -- after "transconductance" |
| Column 13, Line 54 | Insert -- of -- after "output" |
| Column 14, Line 60 | Insert -- of -- after "output" |

Signed and Sealed this

Twentieth Day of May, 2008

JON W. DUDAS
*Director of the United States Patent and Trademark Office*